(12) United States Patent
Kang et al.

(10) Patent No.: US 9,405,163 B2
(45) Date of Patent: Aug. 2, 2016

(54) THIN FILM TRANSISTOR SUBSTRATE AND DISPLAY PANEL HAVING THE SAME

(71) Applicant: Samsung Display Co., LTD., Yongin, Gyeonggi-Do (KR)

(72) Inventors: Hyun-Ju Kang, Pocheon-si (KR); Sang-Woo Sohn, Yongin-si (KR); Sang-Won Shin, Yongin-si (KR); Chang-Oh Jeong, Suwon-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 14/664,189

(22) Filed: Mar. 20, 2015

(65) Prior Publication Data
US 2016/0062162 A1    Mar. 3, 2016

(30) Foreign Application Priority Data
Sep. 2, 2014    (KR) .................. 10-2014-0116386

(51) Int. Cl.
| | | |
|---|---|---|
| *G02F 1/1368* | (2006.01) | |
| *H01L 27/12* | (2006.01) | |
| *H01L 29/45* | (2006.01) | |
| *H01L 29/49* | (2006.01) | |
| *H01L 29/417* | (2006.01) | |
| *H01L 29/423* | (2006.01) | |
| *G02F 1/1362* | (2006.01) | |

(52) U.S. Cl.
CPC ........ *G02F 1/1368* (2013.01); *G02F 1/136227* (2013.01); *G02F 1/136286* (2013.01); *H01L 27/124* (2013.01); *H01L 29/41733* (2013.01); *H01L 29/42384* (2013.01); *H01L 29/45* (2013.01); *H01L 29/4908* (2013.01); *G02F 2001/136222* (2013.01)

(58) Field of Classification Search
CPC ................... G02F 1/136227; G02F 1/136286; G02F 1/1368; H01L 27/124; H01L 29/41733; H01L 29/42384; H01L 29/45; H01L 29/4908
See application file for complete search history.

(56) References Cited

U.S. PATENT DOCUMENTS

| | | | | |
|---|---|---|---|---|
| 2004/0135143 | A1* | 7/2004 | Harano | ............. G03G 15/0131 257/57 |
| 2006/0118786 | A1* | 6/2006 | Kim | ........................ H01L 27/12 257/59 |
| 2007/0045734 | A1* | 3/2007 | Wu | .................... H01L 29/41733 257/347 |
| 2008/0210942 | A1* | 9/2008 | Yang | ....................... H01L 27/12 257/59 |

(Continued)

FOREIGN PATENT DOCUMENTS

| | | |
|---|---|---|
| JP | 11-284195 | 10/1999 |
| JP | 2007-081385 | 3/2007 |
| KR | 1020030089268 A | 11/2003 |

*Primary Examiner* — Allan R Wilson
(74) *Attorney, Agent, or Firm* — Innovation Counsel LLP

(57) ABSTRACT

A thin film transistor substrate includes a base substrate and a thin film transistor. The base substrate includes a gate line and a data line. The thin film transistor is connected to the gate line and the data line. The thin film transistor includes a gate electrode, a semiconductor pattern and source, drain electrodes. The gate electrode is disposed on the base substrate. The semiconductor pattern overlaps with the gate electrode. The source, drain electrodes is spaced apart from each other. The source electrode includes a first source layer, a second source layer disposed on the first source layer and a first diffusion barrier disposed between the first source layer and second source layer. The drain electrode includes a first drain layer, a second drain layer disposed on the first drain layer and a second diffusion barrier disposed between the first drain layer and second drain layer.

18 Claims, 5 Drawing Sheets

(56) References Cited

U.S. PATENT DOCUMENTS

| | | | |
|---|---|---|---|
| 2009/0153056 A1* | 6/2009 | Chen | H01L 29/458 315/51 |
| 2010/0065848 A1* | 3/2010 | Lee | G02F 1/136209 257/59 |
| 2011/0186843 A1* | 8/2011 | Kim | C23C 14/14 257/57 |
| 2014/0094038 A1 | 4/2014 | Haverkamp et al. | |
| 2014/0094568 A1 | 4/2014 | James et al. | |

* cited by examiner

THIN FILM TRANSISTOR SUBSTRATE AND DISPLAY PANEL HAVING THE SAME

PRIORITY STATEMENT

This U.S. non-provisional application claims priority under 35 U.S.C. §119 to Korean Patent Application No. 10-2014-0116386, filed on Sep. 2, 2014, the disclosure of which is incorporated by reference herein in its entirety.

BACKGROUND

1. Field

Exemplary embodiments of the present system and method relate to a display apparatus, and more particularly, to a thin film transistor substrate and a display panel having the thin film transistor substrate.

2. Description of the Related Art

A display apparatus may be a flat panel display FPD and include a liquid crystal display ("LCD"), a plasma display panel ("PDP") and an organic light emitting display ("OLED"). A liquid crystal display apparatus applies voltages to the liquid crystal molecules to adjust the arrangement of the molecules, thereby changing the optical characteristics of the liquid crystal molecules, such as birefringence, optical activity, dichroism and light scattering, to display an image.

The liquid crystal display apparatus includes a liquid crystal display panel for displaying an image and a backlight unit for providing light to the liquid crystal display panel. The liquid crystal display panel may include a signal line pattern formed as a plurality of metal layers, and each metal layer may include different metals. The metal layers may have different densities. As such, metal atoms of one metal layer may diffuse to an adjacent metal layer to form a metal diffused area that is thermodynamically stable. When this happens, a portion of the metal layers may not be etched completely during an etching process, and the electrical properties of the thin film transistor may be deteriorated by a remaining portion of the metal layers.

SUMMARY

Example embodiments provide a thin film transistor substrate with improved electrical properties.

Example embodiments also provide a display panel having the thin film transistor substrate.

In accordance with an exemplary embodiment of the present system and method, a thin film transistor substrate includes a base substrate and a thin film transistor. The base substrate includes a gate line and a data line. The thin film transistor is connected to the gate line and the data line. The thin film transistor includes a gate electrode, a semiconductor pattern and source, drain electrodes. The gate electrode is disposed on the base substrate. The semiconductor pattern overlaps with the gate electrode. The source, drain electrodes is spaced apart from each other. The source electrode includes a first source layer, a second source layer disposed on the first source layer and a first diffusion barrier disposed between the first source layer and second source layer. The drain electrode includes a first drain layer, a second drain layer disposed on the first drain layer and a second diffusion barrier disposed between the first drain layer and second drain layer.

In an exemplary embodiment of the present system and method, the first source layer and the first drain layer may comprise molybdenum (Mo), and the second source layer and the second drain layer may comprise aluminum (Al).

In an exemplary embodiment of the present system and method, the first diffusion barrier and the second diffusion barrier may comprise at least one selected from the group consisting of molybdenum oxide (MoOx), molybdenum nitride (MoNx), aluminum oxide (AlOx), aluminum nitride (AlNx), molybdenum oxynitride (MoOxNy), and aluminum oxynitride (AlOxNy).

In an exemplary embodiment of the present system and method, the source electrode and the drain electrode may have a thickness of about 500 Å to about 3,000 Å.

In an exemplary embodiment of the present system and method, the first diffusion barrier and the second diffusion barrier may have a thickness of about 50 Å to about 300 Å.

In an exemplary embodiment of the present system and method, the data line may include a first data layer, a second data layer disposed on the first data layer and a third diffusion barrier disposed between the first data layer and second data layer.

In an exemplary embodiment of the present system and method, the third diffusion barrier may include a material substantially the same as that of the first diffusion barrier and the second diffusion barrier.

In an exemplary embodiment of the present system and method, the gate line and the gate electrode may include a first gate layer, a second gate layer disposed on the first gate layer and a third diffusion barrier disposed between the first gate layer and second gate layer.

In an exemplary embodiment of the present system and method, the third diffusion barrier may include a material substantially the same as that of the first diffusion barrier and the second diffusion barrier.

In an exemplary embodiment of the present system and method, the thin film transistor may further include a data insulating layer covering the thin film transistor, a color filter disposed on the data insulating layer and a pixel electrode disposed on the color filter and electrically connected to the drain electrode.

In accordance with an exemplary embodiment of the present system and method, a display panel includes a first substrate, second substrate and a thin film transistor. The first substrate includes a gate line and a data line. The second substrate faces the first substrate. The thin film transistor is connected to the gate line and the data line. The thin film transistor includes a gate electrode, a semiconductor pattern and source, drain electrodes. The gate electrode is disposed on the first substrate. The semiconductor pattern overlaps with the gate electrode. The source, drain electrodes is spaced apart from each other. The source electrode includes a first source layer, a second source layer disposed on the first source layer and a first diffusion barrier disposed between the first source layer and second source layer. The drain electrode includes a first drain layer, a second drain layer disposed on the first drain layer and a second diffusion barrier disposed between the first drain layer and second drain layer.

In an exemplary embodiment of the present system and method, the first source layer and the first drain layer may comprise molybdenum (Mo), and the second source layer and the second drain layer may comprise aluminum (Al).

In an exemplary embodiment of the present system and method, the first diffusion barrier and the second diffusion barrier may comprise at least one selected from the group consisting of molybdenum oxide (MoOx), molybdenum nitride (MoNx), aluminum oxide (AlOx), aluminum nitride (AlNx), molybdenum oxynitride (MoOxNy), and aluminum oxynitride (AlOxNy).

In an exemplary embodiment of the present system and method, the source electrode and the drain electrode may have a thickness of about 500 Å to about 3,000 Å.

In an exemplary embodiment of the present system and method, the first diffusion barrier and the second diffusion barrier may have a thickness of about 50 Å to about 300 Å.

In an exemplary embodiment of the present system and method, the data line may include a first data layer, a second data layer disposed on the first data layer and a third diffusion barrier disposed between the first data layer and second data layer.

In an exemplary embodiment of the present system and method, the third diffusion barrier may include a material substantially the same as that of the first diffusion barrier and the second diffusion barrier.

In an exemplary embodiment of the present system and method, the gate line and the gate electrode may include a first gate layer, a second gate layer disposed on the first gate layer and a third diffusion barrier disposed between the first gate layer and second gate layer.

In an exemplary embodiment of the present system and method, the third diffusion barrier may include a material substantially the same as that of the first diffusion barrier and the second diffusion barrier.

In an exemplary embodiment of the present system and method, the thin film transistor may further include a data insulating layer covering the thin film transistor, a color filter disposed on the data insulating layer and a pixel electrode disposed on the color filter, and electrically connected to the drain electrode.

In accordance with example embodiments of the present system and method, the electrical properties of a thin film transistor, and therefore the reliability of a display panel implementing the thin film transistor, are improved.

BRIEF DESCRIPTION OF THE DRAWINGS

The present disclosure includes detailed exemplary embodiments thereof with reference to the accompanying drawings, in which.

DETAILED DESCRIPTION

Hereinafter, exemplary embodiments are described in detail with reference to the accompanying drawings.

Figure 1:
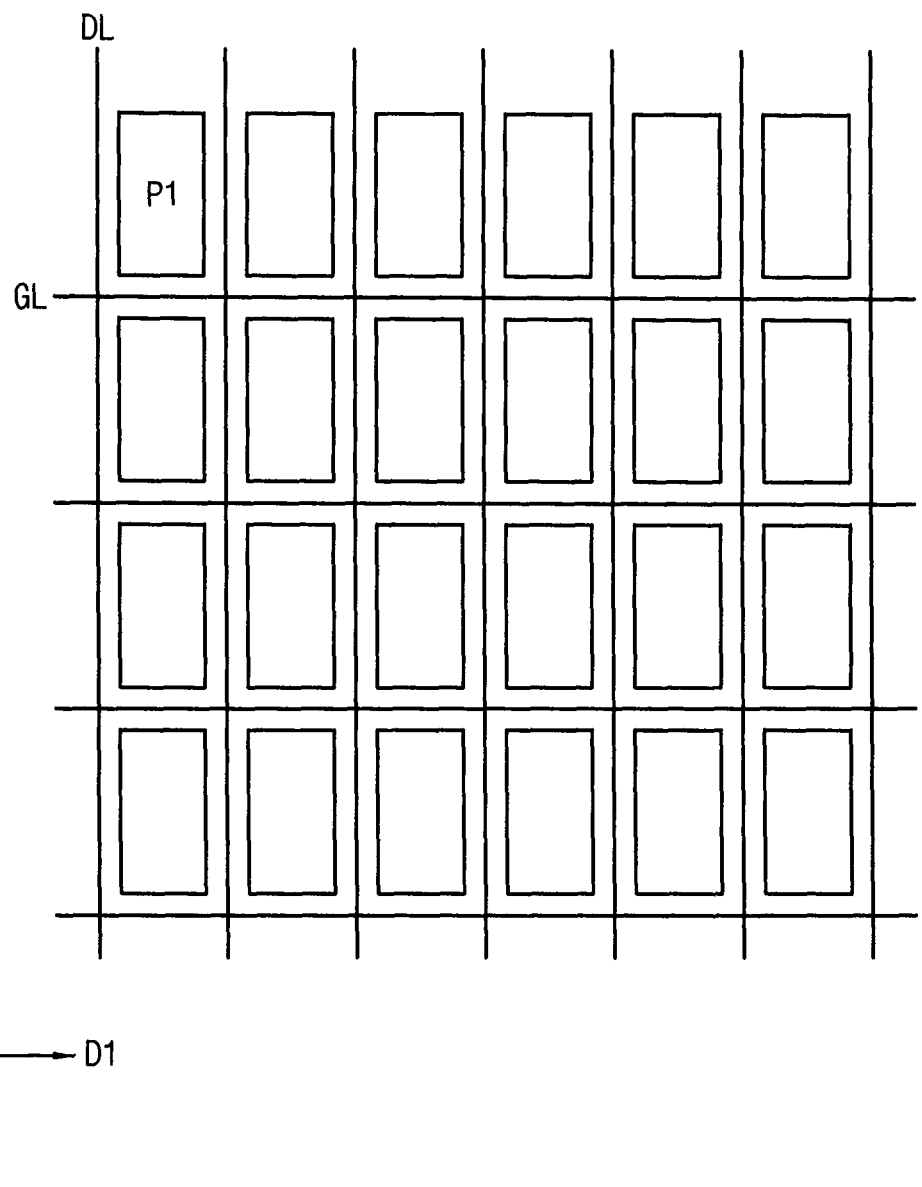
FIG. 1 is a plan view illustrating a display panel in accordance with an exemplary embodiment of the present system and method.

FIG. 1 is a plan view illustrating a display panel in accordance with an exemplary embodiment of the present system and method. Referring to FIG. 1, a display panel includes a plurality of gate lines GL, a plurality of data lines DL and a plurality of pixels.

The gate lines GL of FIG. 1 extend in a first direction D1, while the data lines DL extend in a second direction D2 substantially perpendicular to the first direction D1. Alternatively, the gate lines GL may extend in the second direction D2 and the data lines DL may extend in the first direction D1.

The pixels of FIG. 1 are arranged in a matrix shape and disposed in areas defined by the gate lines GL and the data lines DL. Each pixel is connected to a corresponding gate line GL and a corresponding data line DL adjacent to the pixel. Each pixel has a rectangle shape and extends lengthwise in the second direction D2. In other embodiments, the pixels may have a V-shape, a Z-shape or the like.

Figure 2:
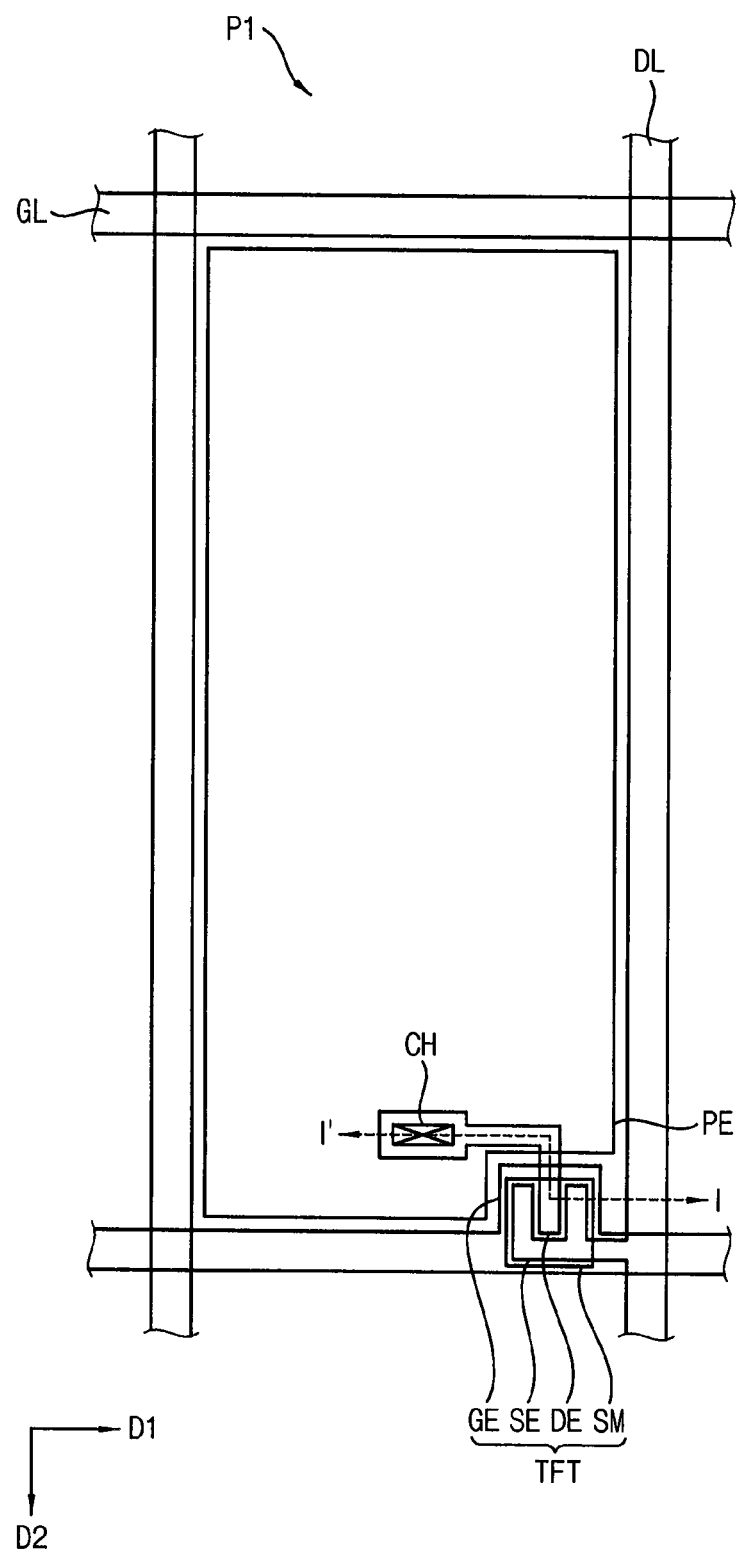
FIG. 2 is a plan view illustrating a first pixel of the display panel in FIG. 1.
Figure 3:
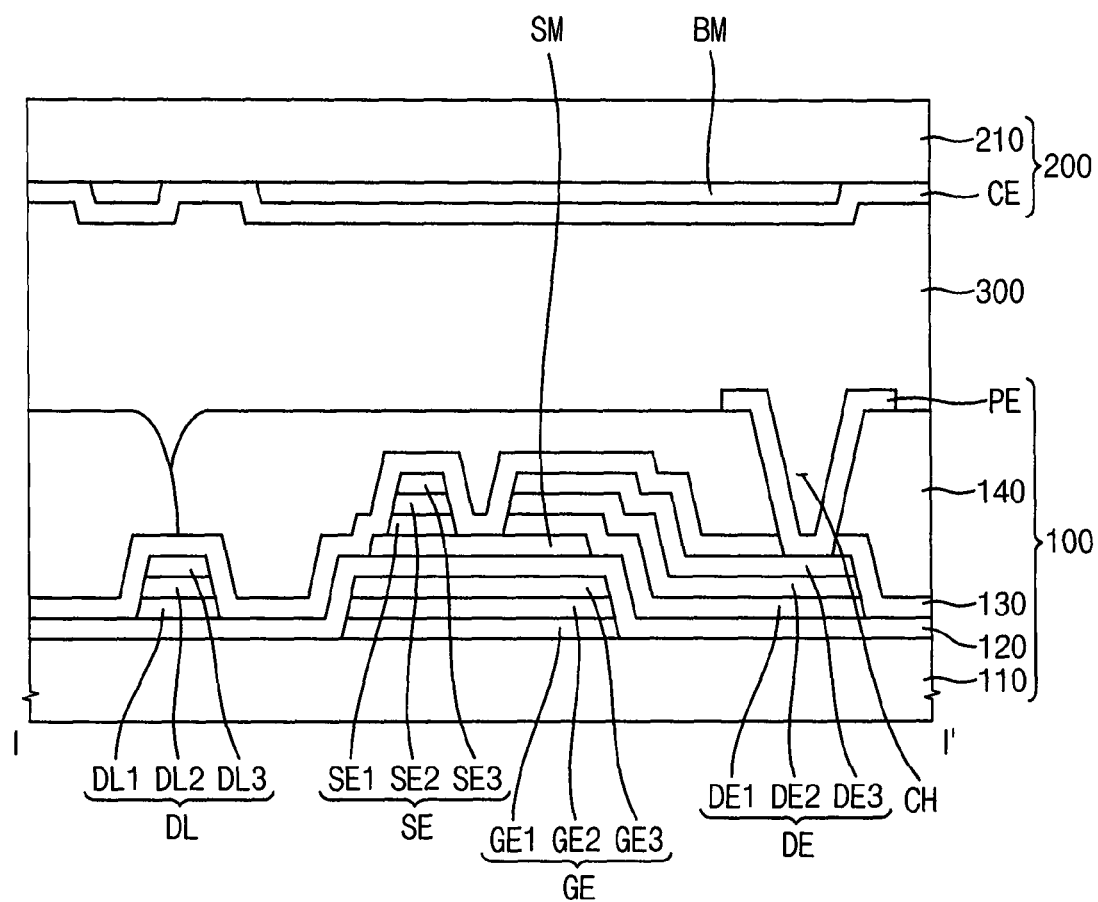
FIG. 3 is a cross-sectional view taken along the line I-I' in FIGS. 2.

FIG. 2 is a plan view illustrating a first pixel PX1 of the display panel in FIG. 1, according to an exemplary embodiment of the present system and method. FIG. 3 is a cross-sectional view taken along the line I-I' in FIG. 2, according to an exemplary embodiment of the present system and method.

Referring to FIGS. 1 to 3, the display panel includes a first substrate 100, a second substrate 200 and a liquid crystal layer 300. The first substrate 100 includes a first base substrate 110, a gate insulating layer 120, a data insulating layer 130, thin film transistors TFT, a color filter 140 and a pixel electrode PE.

The first base substrate 110 may be a transparent insulating substrate. Examples of the transparent insulating substrate include, but are not limited to, a glass substrate, a plastic substrate or the like. The first base substrate 110 may include a plurality of pixel areas for displaying an image. The plurality of the pixel areas may be disposed in a matrix shape having a plurality of rows and a plurality of columns.

Each pixel may further include a switching element. For example, the switching element may be a thin film transistor TFT, such as that shown in FIG. 2. The switching element may be connected to the gate line GL and the data line DL adjacent to the switching element. The switching element may be disposed at a crossing area of the gate line GL and the data line DL.

The gate line GL and a gate electrode GE electrically connected to the gate line GL may be formed as a gate pattern. The gate pattern of FIG. 3 is disposed on the first base substrate 110.

The gate insulating layer 120 of FIG. 3 is formed on the first base substrate 110 and covers the gate pattern and insulates the gate pattern. The gate insulating layer 120 may include an inorganic insulating material. For example, the gate insulating layer 120 may include silicon oxide (SiOx) or silicon nitride (SiNx).

A semiconductor pattern SM is disposed on the gate insulating layer 120 of FIG. 3. The semiconductor pattern SM overlaps the gate electrode GE.

The data line DL, a source electrode SE and a drain electrode DE may be formed as a data pattern. The data pattern of FIG. 3 is disposed on the semiconductor pattern SM, which is formed on the gate insulating layer 120. The source electrode SE overlaps the semiconductor pattern SM. As FIG. 2 shows, the source electrode SE is electrically connected to the data line DL.

The drain electrode DE of FIG. 3 is spaced apart from the source electrode SE. The semiconductor pattern SM may have a conductive channel between the source electrode SE and the drain electrode DE.

The source electrode SE formed on the semiconductor pattern SM and the drain electrode DE partially formed on the semiconductor pattern SM are formed as multilayers in FIG. 3. For example, the source electrode SE includes a first source layer SE1, a second source layer SE3 disposed on the first source layer SE1, and a first diffusion barrier SE2 disposed between the first source layer SE1 and the second source layer SE3. Similarly, the drain electrode DE includes a first drain layer DE1, a second drain layer DE3 disposed on the first drain layer DE1, and a second diffusion barrier DE2 disposed between the first drain layer DE1 and the second drain layer DE3.

The first source layer SE1 and the first drain layer DE1 may be formed from the same layer. The second source layer SE3 and the second drain layer DE3 may be formed from the same layer. The first diffusion barrier SE2 and the second diffusion barrier DE2 may be formed from the same layer. That is, the first source layer SE1 and the first drain layer DE1 may include the same material, the second source layer SE3 and the second drain layer DE3 may include the same material, and the first diffusion barrier SE2 and the second diffusion barrier DE2 may include the same material.

The first diffusion barrier SE2 and the second diffusion barrier DE2 prevent the metal atoms of one metal layer from diffusing to an adjacent metal layer. For example, the first diffusion barrier SE2 disposed between the first source layer SE1 and the second source layer SE3 prevents the diffusion of metal atoms between the first source layer SE1 and the second source layer SE3. Similarly, the second diffusion barrier DE2 disposed between the first drain layer DE1 and the second drain layer DE3 prevents the diffusion of metal atoms between the first drain layer SE1 and the second drain layer SE3.

The diffusion barrier layer from which the first diffusion barrier SE2 and the second diffusion barrier DE2 are formed prevents the formation of metal diffused areas. This means that a metal pattern including the source electrode SE and the drain electrode DE is etched more completely when forming the conductive channel. Particularly, by etching away parts of the metal pattern that overlap with the conductive channel between the source electrode SE and the drain electrode DE, the reliability of the thin film transistor is improved.

The first source layer SE1 and the first drain layer DE1 may include molybdenum (Mo). The second source layer SE3 and the second drain layer SE3 may include aluminum (Al). The first diffusion barrier SE2 and the second diffusion barrier DE2 may include molybdenum oxide (MoOx), molybdenum nitride (MoNx), aluminum oxide (AlOx), aluminum nitride (AlNx), molybdenum oxynitride (MoOxNy), and/or aluminum oxynitride (AlOxNy).

The source electrode SE and the drain electrode DE may have a thickness of about 500 Å to about 3,000 Å. The thickness of the first diffusion barrier SE2 and the second diffusion barrier DE2 may be about 10% of the thickness of the source electrode SE and the drain electrode DE. For example, the first diffusion barrier SE2 and the second diffusion barrier DE2 may have a thickness of about 50 Å to about 300 Å. When the thickness of the first diffusion barrier SE2 and the second diffusion barrier DE2 is less than 50 Å, diffusion of metal atoms may not be prevented. When the thickness of the first diffusion barrier SE2 and the second diffusion barrier DE2 is more than 300 Å, the electrical properties of the thin film transistor may be deteriorated.

The data line DL of FIG. 3 is disposed on the gate insulating layer 120. The data line DL includes a first data layer DL1, a second data layer DL3 and a third diffusion barrier DL2. The third diffusion barrier DL2 is disposed on the first data layer DL1. The second data layer DL3 is disposed on the third diffusion barrier DL2. Thus, the third diffusion barrier DL2 is disposed between the first data layer DL1 and the second data layer DL3.

The first data layer DL1 may include a material substantially the same as that of the first source layer SE1 and the first drain layer DEL The second data layer DL3 may include a material substantially the same as that of the second source layer SE3 and the second drain layer DE3. The third diffusion barrier DL2 may include a material substantially the same as that of the first diffusion barrier SE2 and the second diffusion barrier DE2.

The thin film transistor TFT of FIG. 2 includes the gate electrode GE, the source electrode SE, the drain electrode DE and the semiconductor pattern SM. The gate electrode GE and the gate line GL may be formed as multilayers. For example, the gate electrode GE and the gate line GL of FIG. 3 includes a first gate layer GE1, a second gate layer GE3 and a fourth diffusion barrier GE2.

The fourth diffusion barrier GE2 is disposed on the first gate layer GE1. The second gate layer GE3 is disposed on the fourth diffusion barrier GE2. Thus, the fourth diffusion barrier GE2 is disposed between the first gate layer GE1 and the second gate layer GE3.

The first gate layer GE1 may include a material substantially the same as that of the first source layer SE1 and the first drain layer DE1. The second gate layer GE3 may include a material substantially the same as that of the second source layer SE3 and the second drain layer DE3. The fourth diffusion barrier GE2 may include a material substantially the same as that of the first diffusion barrier SE2 and the second diffusion barrier DE2.

The data insulating layer 130 of FIG. 3 is disposed on the gate insulating layer 120 and insulates the data pattern. The data insulating layer 130 may include an inorganic insulating material. For example, the data insulating layer 130 may include silicon oxide (SiOx) or silicon nitride (SiNx).

The color filter 140 of FIG. 3 is disposed on the data insulating layer 130 between adjacent data lines DL. The color filter 140 changes the color of the light being transmitted by the liquid crystal layer 300.

Each of the color filters 140 may correspond to one of the pixel areas. The color filters 140 may include a red color filter, green color filter and a blue color filter. The color filters 140 that are adjacent to each other may have different colors from each other. The color filters 140 may be spaced apart from a border between pixel areas that are adjacent to each other in the first direction D1.

The color filters 140 may be formed with an island-shape on the gate lines GL and the data lines DL. Alternatively, the color filters 140 may overlap at the border between pixel areas adjacent to each other.

The pixel electrode PE may be disposed in the pixel area. The pixel electrode PE of FIG. 3 is disposed on the color filter 140 and electrically connected to the drain electrode DE of the thin film transistor TFT through a contact hole CH. A grayscale voltage may be applied to the pixel electrode PE through the thin film transistor TFT.

The pixel electrode PE may include a transparent conductive material, such as indium tin oxide (ITO), indium zinc oxide (IZO) and aluminum zinc oxide (AZO). The pixel electrode PE may have a slit pattern.

The second substrate 200 of FIG. 3 includes a second base substrate 210, a black matrix BM and a common electrode CE. The black matrix BM may overlap the thin film transistor TFT and a signal line connected to the thin film transistor TFT. For example, the black matrix BM may overlap the data line DL extended in the second direction D2 and/or the gate line GL extended in the first direction D1. That is, the black matrix BM may be disposed in a non-display area of the pixel, including on a border between pixel areas adjacent to each other. The black matrix BM blocks light emitted from adjacent pixels and may include a photosensitive organic material such as a carbon black pigment or the like.

The common electrode CE of FIG. 3 is formed on the black matrix BM and the second base substrate 210. The common electrode CE may include a transparent conductive material, such as indium tin oxide (ITO), indium zinc oxide (IZO) and aluminum-doped zinc oxide (AZO).

The liquid crystal layer 300 of FIG. 3 is disposed between the first substrate 100 and the second substrate 200 and includes liquid crystal molecules. By controlling the alignment of the liquid crystal molecules in the liquid crystal layer 300 with an electric field applied between the pixel electrode PE and the common electrode CE, the light transmittance of the pixels is controlled.

Figure 4A:
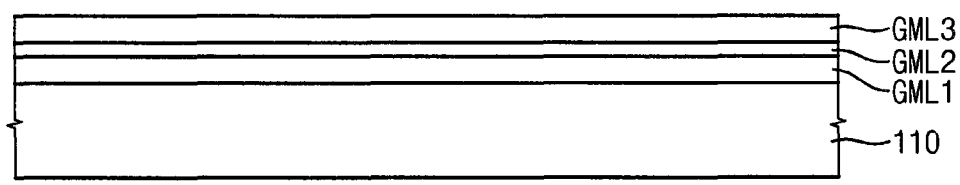
FIGS. 4A, 4B, 4C, and 4D are cross-sectional views illustrating a method of manufacturing a display panel in accordance with exemplary embodiments of the present system and method.
Figure 4B:
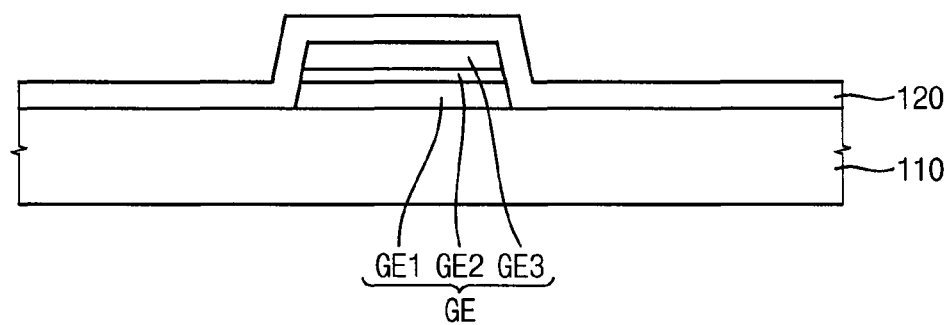

FIGS. 4A to 4D are cross-sectional views illustrating a method of manufacturing a display panel in accordance with exemplary embodiments of the present system and method. Referring to FIGS. 4A and 4B, a first gate metal layer GML1 is formed on a base substrate 110, a gate diffusion barrier GML2 is formed on the first gate metal layer GML1, a second gate metal layer GML3 is formed on the gate diffusion barrier GML2. That is, the first gate metal layer GML1, the gate diffusion barrier GML2 and the second gate metal layer GML3 may be formed in order.

The first gate metal layer GML1, the gate diffusion barrier GML2 and the second gate metal layer GML3 may be formed by a sputtering process. The first gate metal layer GML1 may include molybdenum (Mo). The second gate metal layer GML3 may include aluminum (Al). The gate diffusion barrier GML2 may include molybdenum oxide (MoOx), molybdenum nitride (MoNx), aluminum oxide (AlOx), aluminum nitride (AlNx), molybdenum oxynitride (MoOxNy), and/or aluminum oxynitride (AlOxNy).

A photoresist material may be coated on the first gate metal layer GML1, the gate diffusion barrier GML2 and the second gate metal layer GML3. A photo pattern in the shape of a gate electrode GE may be formed using a mask. The first gate metal layer GML1, the gate diffusion barrier GML2 and the second gate metal layer GML3 may be etched using the photo pattern as a mask to form the gate electrode GE. The first gate metal layer GML1, the gate diffusion barrier GML2 and the second gate metal layer GML3 may be etched using a dry etch process.

An inorganic material is deposited on the gate electrode GE and the base substrate 110 in FIG. 2 to form a gate insulating layer 120 that insulates the gate electrode GE. The inorganic insulating material may include silicon oxide (SiOx) or silicon nitride (SiNx).

Figure 4C:
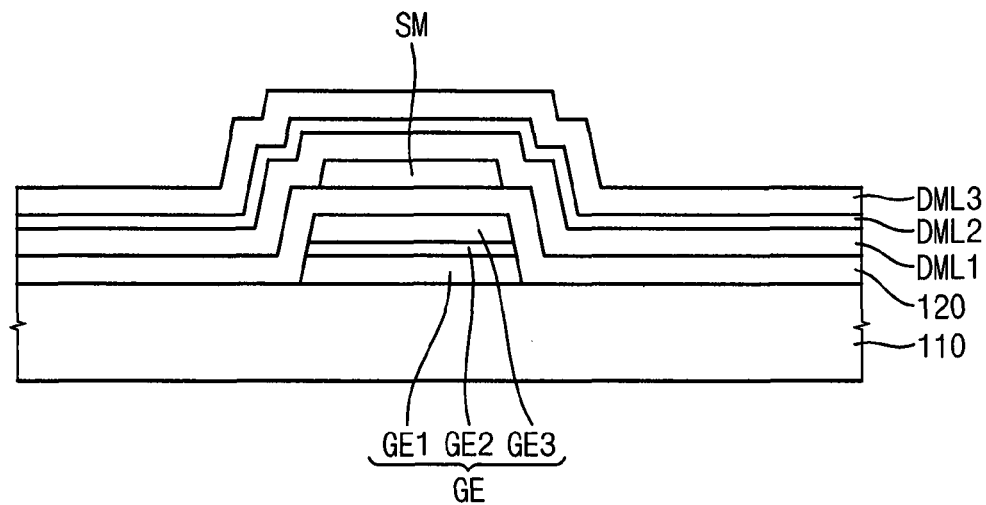
Figure 4D:
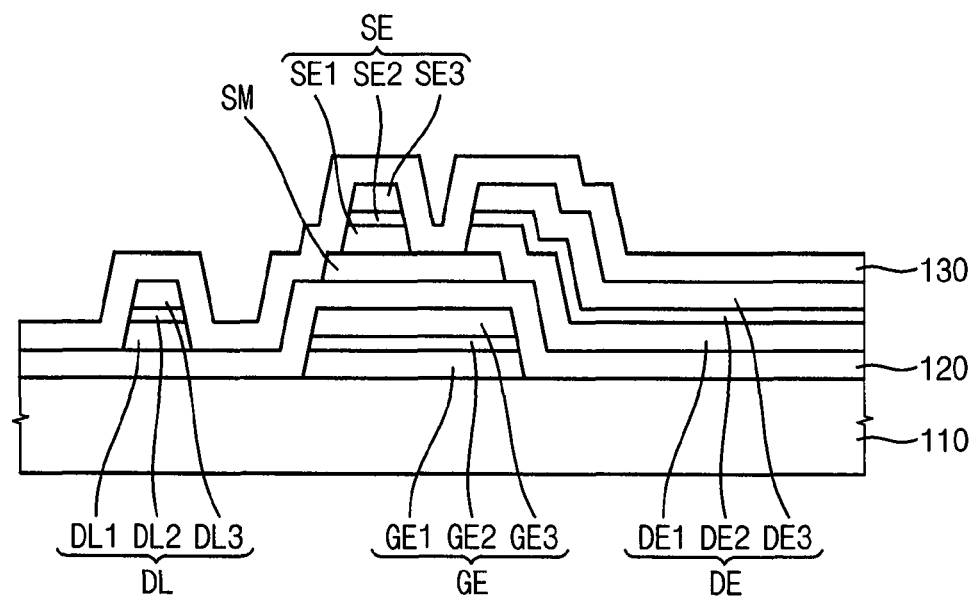

Referring to FIGS. 4C and 4D, a semiconductor pattern SM is formed on the gate insulating layer 120. The semiconductor pattern SM overlaps the gate electrode GE. A first data metal layer DML1 is formed on the semiconductor pattern SM and the gate insulating layer 120. A data diffusion barrier DML2 is formed on the first data metal layer DML1. A second data metal layer DML3 is formed on the data diffusion barrier DML2. Thus, the first data metal layer DML1, the data diffusion barrier DML2 and the second data metal layer DML3 may be formed in order.

The first data metal layer DML1, the data diffusion barrier DML2 and the second data metal layer DML3 may be formed by a sputtering process. The first data metal layer DML1 may include molybdenum (Mo). The second data metal layer DML3 may include aluminum (Al). For example, the data diffusion barrier DML2 may include molybdenum oxide (MoOx), molybdenum nitride (MoNx), aluminum oxide (AlOx), aluminum nitride (AlNx), molybdenum oxynitride (MoOxNy), and/or aluminum oxynitride (AlOxNy).

A photoresist material may be coated on the first data metal layer DML1, the data diffusion barrier DML2 and the second data metal layer DML3. A photo pattern in the shape of a data line DL, a source electrode SE and a drain electrode DE may be formed using a mask. The first data metal layer DML1, the data diffusion barrier DML2 and the second data metal layer DML3 may be etched using the photo pattern as a mask to form the data line DL, the source electrode SE and the drain electrode DE. The mask may be a half tone mask. The first data metal layer DML1, the data diffusion barrier DML2 and the second data metal layer DML3 may be etched by a dry etch process.

An inorganic material is deposited on the data line DL, the source electrode SE and the drain electrode DE, and the base substrate 110 to form a data insulating layer 130. The data insulating layer 130 insulates the data line DL, the source electrode SE and the drain electrode DE. The inorganic insulating material may include silicon oxide (SiOx) or silicon nitride (SiNx).

In accordance with exemplary embodiments of the present system and method, the method of forming a fine metal pattern and the method of manufacturing the display substrate may apply to a liquid crystal display apparatus, an organic electroluminescent apparatus or the like.

The foregoing is illustrative of the present system and method and is not limiting thereof. Although exemplary embodiments of the present system and method are described, those skilled in the art would appreciate that modifications are possible in the exemplary embodiments without materially departing from the teachings and advantages of the present system and method. Accordingly, all such modifications are intended to be included within the scope of the present system and method.

What is claimed is:

1. A thin film transistor substrate comprising:
   a base substrate including a gate line and a data line; and
   a thin film transistor connected to the gate line and the data line, the thin film transistor comprising:
      a gate electrode disposed on the base substrate;
      a semiconductor pattern overlapping with the gate electrode; and
      source and drain electrodes spaced apart from each other,
   wherein the source electrode comprises a first source layer, a second source layer disposed on the first source layer and a first diffusion barrier disposed between the first source layer and second source layer,
   the drain electrode comprises a first drain layer, a second drain layer disposed on the first drain layer and a second diffusion barrier disposed between the first drain layer and second drain layer, and
   the first source layer and the first drain layer comprise molybdenum (Mo), nad the second source layer and the second drain layer comprise aluminum (Al).

2. The thin film transistor substrate of claim 1, wherein the first diffusion barrier and the second diffusion barrier comprise at least one selected from the group consisting of molybdenum oxide (MoOx), molybdenum nitride (MoNx), aluminum oxide (AlOx), aluminum nitride (AlNx), molybdenum oxynitride (MoOxNy), and aluminum oxynitride (AlOxNy).

3. The thin film transistor substrate of claim 1, wherein the source electrode and the drain electrode have a thickness of about 500 Å to about 3,000 Å.

4. The thin film transistor substrate of claim 3, wherein the first diffusion barrier and the second diffusion barrier have a thickness of about 50 Å to about 300 Å.

5. A thin film transistor substrate comprising:
   a base substrate including a gate line and a data line; and
   a thin film transistor connected to the gate line and the data line, the thin film transistor comprising:

a gate electrode disposed on the base substrate;
a semiconductor pattern overlapping with the gate electrode; and
source and drain electrodes spaced apart from each other,
wherein the source electrode comprises a first source layer, a second source layer disposed on the first source layer and a first diffusion barrier disposed between the first source layer and second source layer,
the drain electrode comprises a first drain layer, a second drain layer disposed on the first drain layer and a second diffusion barrier disposed between the first drain layer and second drain layer, and
the data line comprises a first data layer, a second data layer disposed on the first data layer and a third diffusion barrier disposed between the first data layer and second data layer.

6. The thin film transistor substrate of claim 5, wherein the third diffusion barrier comprises a material substantially the same as that of the first diffusion barrier and the second diffusion barrier.

7. The thin film transistor substrate of claim 5, wherein the gate line and the gate electrode comprise a first gate layer, a second gate layer disposed on the first gate layer and a third diffusion barrier disposed between the first gate layer and second gate layer.

8. The thin film transistor substrate of claim 7, wherein the third diffusion barrier comprises a material substantially the same as that of the first diffusion barrier and the second diffusion barrier.

9. The thin film transistor substrate of claim 5, further comprising:
a data insulating layer covering the thin film transistor;
a color filter disposed on the data insulating layer; and
a pixel electrode disposed on the color filter and electrically connected to the drain electrode.

10. A display panel comprising:
a first substrate including a gate line and a data line;
a second substrate facing the first substrate; and
a thin film transistor connected to the gate line and the data line, the thin film transistor comprising:
a gate electrode disposed on the first substrate;
a semiconductor pattern overlapping with the gate electrode; and
source and drain electrodes spaced apart from each other,
wherein the source electrode comprises a first source layer, a second source layer disposed on the first source layer and a first diffusion barrier disposed between the first source layer and second source layer,
the drain electrode comprises a first drain layer, a second drain layer disposed on the first drain layer and a second diffusion barrier disposed between the first drain layer and second drain layer, and
the first source layer and the first drain layer comprise molybdenum (Mo), and the second source layer and the second drain layer comprise aluminum (Al).

11. The display panel of claim 10, wherein the first diffusion barrier and the second diffusion barrier comprise at least one selected from the group consisting of molybdenum oxide (MoOx), molybdenum nitride (MoNx), aluminum oxide (AlOx), aluminum nitride (AlNx), molybdenum oxynitride (MoOxNy), and aluminum oxynitride (AlOxNy).

12. The display panel of claim 10, wherein the source electrode and the drain electrode have a thickness of about 500 Å to about 3,000 Å.

13. The display panel of claim 12, wherein the first diffusion barrier and the second diffusion barrier have a thickness of about 50 Å to about 300 Å.

14. The display panel of claim 10, wherein the data line comprises a first data layer, a second data layer disposed on the first data layer and a third diffusion barrier disposed between the first data layer and second data layer.

15. The display panel of claim 14, wherein the third diffusion barrier comprises a material substantially the same as that of the first diffusion barrier and the second diffusion barrier.

16. The display panel of claim 10, wherein the gate line and the gate electrode comprise a first gate layer, a second gate layer disposed on the first gate layer and a third diffusion barrier disposed between the first gate layer and second gate layer.

17. The display panel of claim 16, wherein the third diffusion barrier comprises a material substantially the same as that of the first diffusion barrier and the second diffusion barrier.

18. The display panel of claim 10, further comprising:
a data insulating layer covering the thin film transistor;
a color filter disposed on the data insulating layer; and
a pixel electrode disposed on the color filter and electrically connected to the drain electrode.

* * * * *